United States Patent
Tan et al.

(10) Patent No.: US 7,518,447 B1
(45) Date of Patent: Apr. 14, 2009

(54) TRANSIMPEDANCE AMPLIFIER

(75) Inventors: Kee Hian Tan, Singapore (SG); Thart Fah Voo, Singapore (SG)

(73) Assignee: Marvell International Ltd., Hamilton (BM)

(*) Notice: Subject to any disclaimer, the term of this patent is extended or adjusted under 35 U.S.C. 154(b) by 666 days.

(21) Appl. No.: 11/037,733

(22) Filed: Jan. 18, 2005

(51) Int. Cl.
*H03F 1/24* (2006.01)
(52) U.S. Cl. .......................... 330/98; 330/285
(58) Field of Classification Search ................ 330/98, 330/310, 136, 129, 296, 285, 150
See application file for complete search history.

(56) References Cited

U.S. PATENT DOCUMENTS

| | | | |
|---|---|---|---|
| 3,365,673 A * | 1/1968 | Barditch et al. ............ 330/285 |
| 3,737,798 A | 6/1973 | Faraguet et al. |
| 3,760,287 A | 9/1973 | Harris |
| 3,918,005 A | 11/1975 | Bruckenstein et al. |
| 4,535,233 A | 8/1985 | Abraham |
| 4,564,818 A | 1/1986 | Jones |
| 4,724,315 A | 2/1988 | Goerne |
| 4,731,590 A | 3/1988 | Saari |
| 4,764,732 A | 8/1988 | Dion |
| 4,772,859 A | 9/1988 | Sakai |
| 4,914,402 A | 4/1990 | Dermitzakis et al. |
| 4,919,534 A | 4/1990 | Reed |
| 5,010,588 A | 4/1991 | Gimlett |
| 5,042,299 A | 8/1991 | Wells |
| 5,155,455 A | 10/1992 | Cowley et al. |
| 5,345,073 A | 9/1994 | Chang et al. |
| 5,382,920 A | 1/1995 | Jung |
| 5,532,471 A | 7/1996 | Khorramabadi et al. |
| 5,646,573 A | 7/1997 | Bayruns et al. |
| 5,793,230 A | 8/1998 | Chu et al. |
| 6,037,841 A | 3/2000 | Tanji et al. |
| 6,057,738 A | 5/2000 | Ku et al. |
| 6,084,478 A | 7/2000 | Mayampurath |
| 6,114,913 A | 9/2000 | Entrikin |
| 6,122,131 A | 9/2000 | Jeppson |
| 6,292,052 B1 | 9/2001 | Carlson |
| 6,330,279 B1 | 12/2001 | Belser et al. |
| 6,353,324 B1 | 3/2002 | Uber et al. |
| 6,466,091 B1 | 10/2002 | Kejariwal et al. |
| 6,515,540 B1 | 2/2003 | Prasad et al. |
| 6,525,589 B1 | 2/2003 | Thomsen et al. |
| 6,552,605 B1 | 4/2003 | Yoon |
| 6,556,084 B2 * | 4/2003 | Sowlati ................ 330/296 |
| 6,593,810 B2 | 7/2003 | Yoon |

(Continued)

FOREIGN PATENT DOCUMENTS

JP 6-61752 3/1994

(Continued)

OTHER PUBLICATIONS

U.S. Appl. No. 10/072,843, filed Feb. 6, 2002.

(Continued)

*Primary Examiner*—Henry Choe (57) ABSTRACT

A transimpedance amplifier (TIA) circuit comprises an input and an amplifying stage that includes N amplifiers, that generates a first signal and that is AC coupled to the input. A bias stage generates a second signal and that is DC coupled to the input. An output stage is driven by the first signal from the amplifying stage and the second signal from the bias stage.

40 Claims, 3 Drawing Sheets

U.S. PATENT DOCUMENTS

| | | | |
|---|---|---|---|
| 6,642,496 | B1 | 11/2003 | Gulbransen |
| 6,762,644 | B1 | 7/2004 | Sutardja |
| 6,958,656 | B2 * | 10/2005 | Yamashita et al. .......... 330/285 |
| 7,049,892 | B2 * | 5/2006 | Matsunaga et al. .......... 330/285 |
| 2002/0153949 | A1 | 10/2002 | Yoon |

FOREIGN PATENT DOCUMENTS

WO     WO 99/46607     9/1999

OTHER PUBLICATIONS

U.S. Appl. No. 10/459,731, filed Jul. 11, 2003.
U.S. Appl. No. 10/814,534, filed Mar. 31, 2004.
U.S. Appl. No. 10/838,040, filed May 3, 2004.
Charles A. Holt; "Electronic Circuits Digital and Analog", Virginia Polytechnic Institute and State University, pp. 423, 431, 436; 1978.
Fan You, S.H.K. Embabi, Edgar Sanchez-Sinencio; SA 21.2: A Multistage Amplifier Topology with Nested Gm-C Compensation for Low-Voltage Application; 1997 IEEE International Solid-State Circuits Conference, pp. 348-349.
W. Grise, Dept. of IET, Morehead State University, Morehead KY; Application of the Operational Transconductance Amplifier (OTA) to Voltage-controlled Amplifiers and Active Filters; Apr. 29, 1995; 10 pages.
Axel Thomsen, Dan Kasha, Wai Lee, Crystal Semiconductor Division, Cirrus Logic, Inc., Austin, Texas; A Five Stage Chopper Stabilized Instrumentation Amplifier Using Feedforward Conpensation; Jun. 16, 1998; 4 pages.
Axel Thomsen, Edwin de Angel, Sherry Ziachong Wu, Aryesh Amar, Lei Wang, Wai Lee, WA 20.1 A DC Measurement IC with 130nV$_{PP}$ Noise in 10Hz; 2000 IEEE International Solid-State Circuits Conference; May 20, 1994; 9 pages.
Axel Thomsen, Edwin de Angel, Sherry Ziachong Wu, Aryesh Amar, Lei Wang, Wai Lee, WA 20.1 A DC Measurement IC with 130nV$_{PP}$ Noise in 10HZ; ISSCC 2000/Session 20/Oversampled Converters/ Paper WA 20.1 ISSCC 2000 Slide Supplement; Jun. 9, 1993; 5 pages.
M. Moyal, M. Groepl, H. Werker, G. Mitteregger, J. Schambacher; Xignal Technologies AG, Munich, Germany; 23.6 A 700/900mW/ Channel CMOS Dual Analog Front-End IC for VDSL with Integrated 11.5/14.5dBm Line Drivers; 2003 IEEE International Solid-State Circuits Conference; ISSCC 2003/Session 23/Mixed-Signal and Wireline Techniques; Jan. 5, 1993; 10 pages.
M. Moyal, M. Groepl, H. Werker, G. Mitteregger, J. Schambacher; Xignal Technologies AG, Munich, Germany; A 700/900mW/Channel CMOs Dual Analog Front-End IC for VDSL with Integrated 11.5/14.5dBm Line Drivers; Outline, Overview; Mar. 14, 1998; 24 pages.

* cited by examiner

TRANSIMPEDANCE AMPLIFIER

CROSS-REFERENCE TO RELATED APPLICATIONS

This application is related to U.S. patent application Ser. Nos. 10/072,843, filed on Feb. 6, 2002, Ser. No. 10/459,731, filed Jul. 11, 2003, Ser. No. 10/838,040, filed May 3, 2004 and 10/814,534, filed Mar. 31, 2004. The disclosures of the above applications are incorporated herein by reference in their entirety.

FIELD OF THE INVENTION

The present invention relates to amplifiers and more particularly to transimpedance amplifiers.

BACKGROUND OF THE INVENTION

Figure 1:
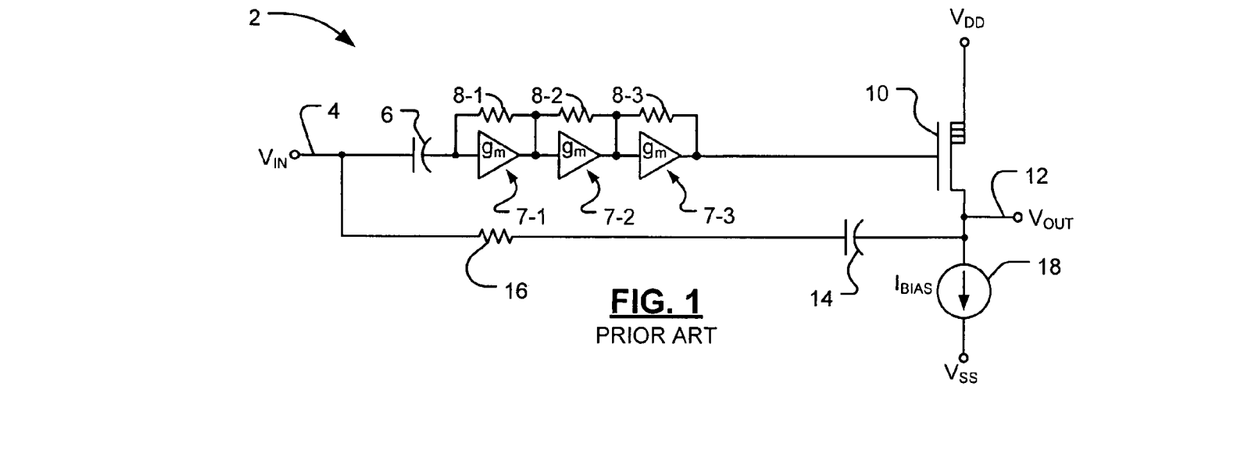
FIG. 1 is an electrical schematic of a TIA according to the prior art.

Referring now to FIG. 1, a transimpedance amplifier (TIA) 2 has an input node 4 that is AC coupled through a capacitor 6 to amplifiers 7-1, 7-2, and 7-3, (collectively referred to as amplifiers 7). Each of the amplifiers 7 has a transconductance ($g_m$) and a respective feedback resistance 8-1, 8-2, and 8-3 (collectively feedback resistances 8). An output of the last amplifier 7-3 is coupled to a gate of a transistor 10. An output node 12 produces VOUT and is taken at a source of the transistor 10. A drain of the transistor 10 is connected to a power supply voltage $V_{DD}$. An AC feedback path is provided to the input node 4 through a feedback capacitor 14 and a feedback resistance 16. A typical capacitance for the feedback capacitor 14 is 35 picofarads (pF). A current source 18 provides a constant current bias $I_{BIAS}$ and is connected between a source of the transistor 10 and a power supply reference voltage $V_{SS}$.

Figure 1A:
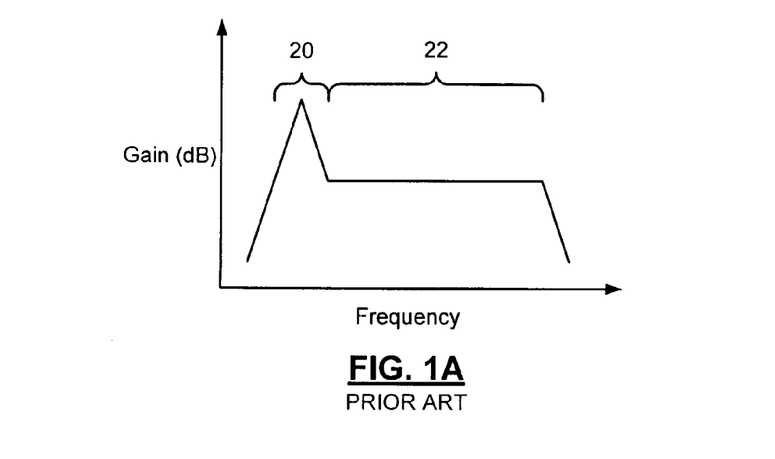
FIG. 1A is a graph depicting the frequency response of the TIA shown in FIG. 1.

Referring now to FIG. 1A, a gain of the TIA 2 of FIG. 1 is shown as a function of frequency. It can be seen that the TIA 2 has an undesirably high gain at low frequencies that are identified at 20. The high gain is caused by an impedance of the capacitor 14 at the low frequencies. At higher frequencies that are identified at 22, the capacitor 14 has a lower impedance and the TIA 2 has a flat gain response.

SUMMARY OF THE INVENTION

A transimpedance amplifier (TIA) circuit comprises an input and an amplifying stage that includes N amplifiers, that generates a first signal and that is AC coupled to the input. A bias stage generates a second signal and is DC coupled to the input. An output stage is driven by the first signal from the amplifying stage and the second signal from the bias stage.

In other features, the N amplifiers are connected in series and each includes an input, an output, and a feedback resistance. The bias stage comprises an op amp having a non-inverting input that communicates with the input.

In yet other features, the bias stage further comprises a first current source and a first transistor having first and second terminals and a control terminal. The first current source communicates with the second terminal of the first transistor and an inverting input of the op-amp. A low pass filter communicates with an output of the bias stage.

In yet other features, a current limiting device communicates with the bias stage and the output stage. The output stage further comprises a second current source and a second transistor having first and second terminals and a control terminal. The second current source communicates with the second terminal of the second transistor.

In other features, the first current source provides a magnitude of current flow that is a fraction of the magnitude of current flowing through the second current source. The output stage is DC-coupled to the input.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses. For purposes of clarity, the same reference numbers will be used in the drawings to identify similar elements.

Figure 2:
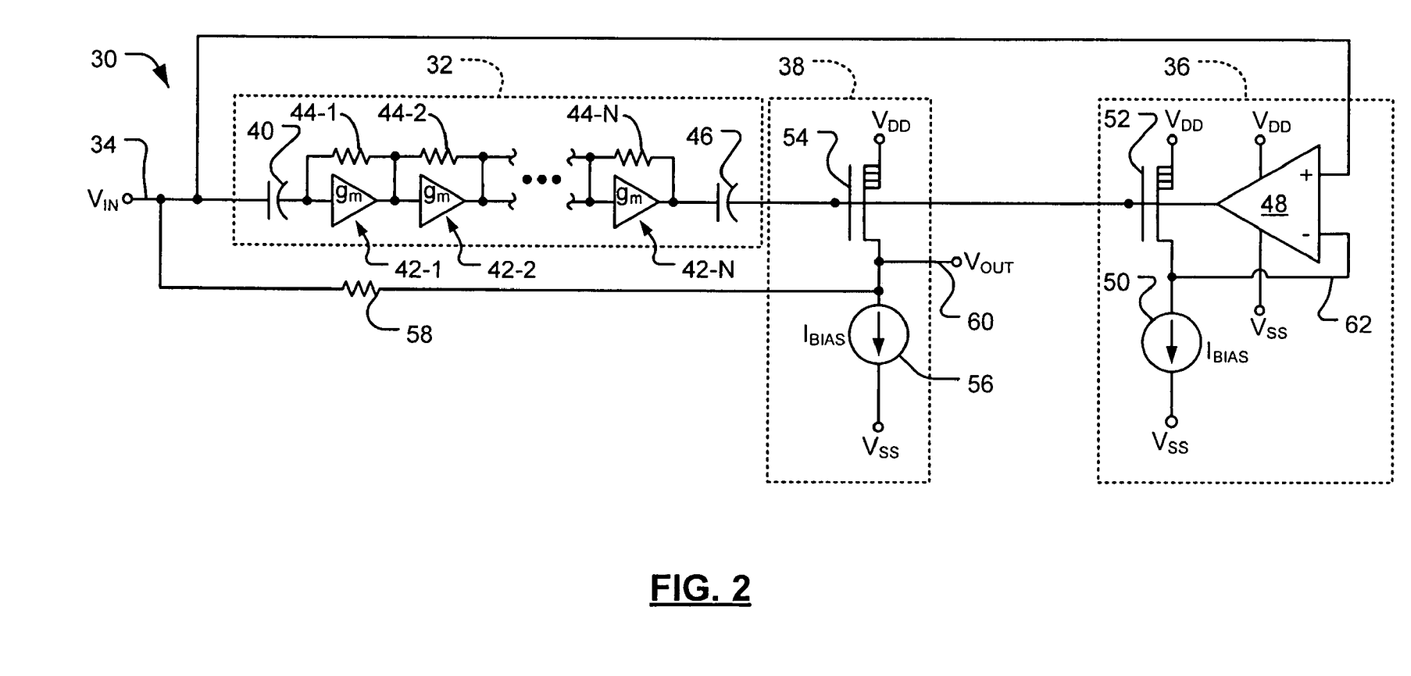
FIG. 2 is an electrical schematic of a TIA according to some implementation of the present invention.

Referring now to FIG. 2, one implementation of a TIA 30 is shown. An amplifying stage 32 has an AC coupled input from an input node 34. A bias stage 36 has a DC coupled input from the input node 34 and generates a very low frequency bias. An output stage 38 receives an amplified signal from the amplifying stage 32 and the bias from the bias stage 36.

The amplifying stage 34 has an input capacitor 40 coupled to an input of a series of amplifiers 42-1, 42-2, . . . , and 42-N (collectively amplifiers 42), each having a transconductance ($g_m$) and a respective feedback resistance 44-1, 44-2, . . . , and 44-N. While three amplifiers 42 are shown, additional or fewer amplifiers may be used depending on a desired power and/or stability. An output of the amplifiers 42 is connected to a series capacitor 46. In some implementations, the capacitance of series capacitor 46 is less than 20 picofarads and preferably approximately 6 picofarads or less. An output of the amplifying stage 32 is connected at the other end of the series capacitor 46.

The bias stage 36 includes an op-amp 48. A non-inverting input of the op-amp 48 is DC coupled to the input node 34. A current source 50 provides current having a magnitude $I_{BIAS}$ and is connected between a source of a transistor 52 and a power supply reference voltage $V_{SS}$. In some implementations, the magnitude of current flow through the current source 50 is a fraction of $I_{BIAS}$ to conserve current and reduce power consumption of the TIA 30. An inverting input of the op-amp 48 is connected to the source of the transistor 52. An output of the op-amp 48 is connected to a gate of the transistor 52. A drain of the transistor 52 is connected to a power supply voltage $V_{DD}$. An output of the bias stage 36 is at the output of the op-amp 48.

The output stage 38 has a transistor 54 having a gate connected to the output of the amplifying stage 32 and to the output of the bias stage 36. A drain of the transistor 54 is connected to the power supply voltage $V_{DD}$. A current source 56 provides current having a magnitude $I_{BIAS}$ and is connected between a source of the transistor 54 and the power supply reference voltage $V_{SS}$. The source of the transistor 54 is also DC coupled to the input node 34 through a feedback resistor 58. An output node 60 for the TIA 30 is at the source of transistor 54.

In operation, the amplifying stage 32 of the TIA 30 amplifies high frequency components of a signal appearing at the input node 34. A low corner frequency of the amplifying stage 32 is determined by the capacitances of the input capacitor 40 and the series capacitor 46. The high-frequency components are amplified by the amplifiers 42 and appear at the output of the amplifying stage 32.

The bias stage 36 receives Vin and generates a DC-bias signal for the transistor 54 in the output stage. In the output stage 38, the gate of the transistor 54 receives a gate signal from the combined output signals of the amplifying stage 32 and the bias stage 36. In some implementations, the transistors 52 and 54 are performance matched. The transistors 52 and 54 may be performance matched by matching their dimensions or size on a semiconductor die. Through this matching, Vout at node 60 is close to the feedback voltage at node 62, which in turn tracks Vin at node 34. As a result, the current flowing through resistor 58 is minimized.

Figure 3:
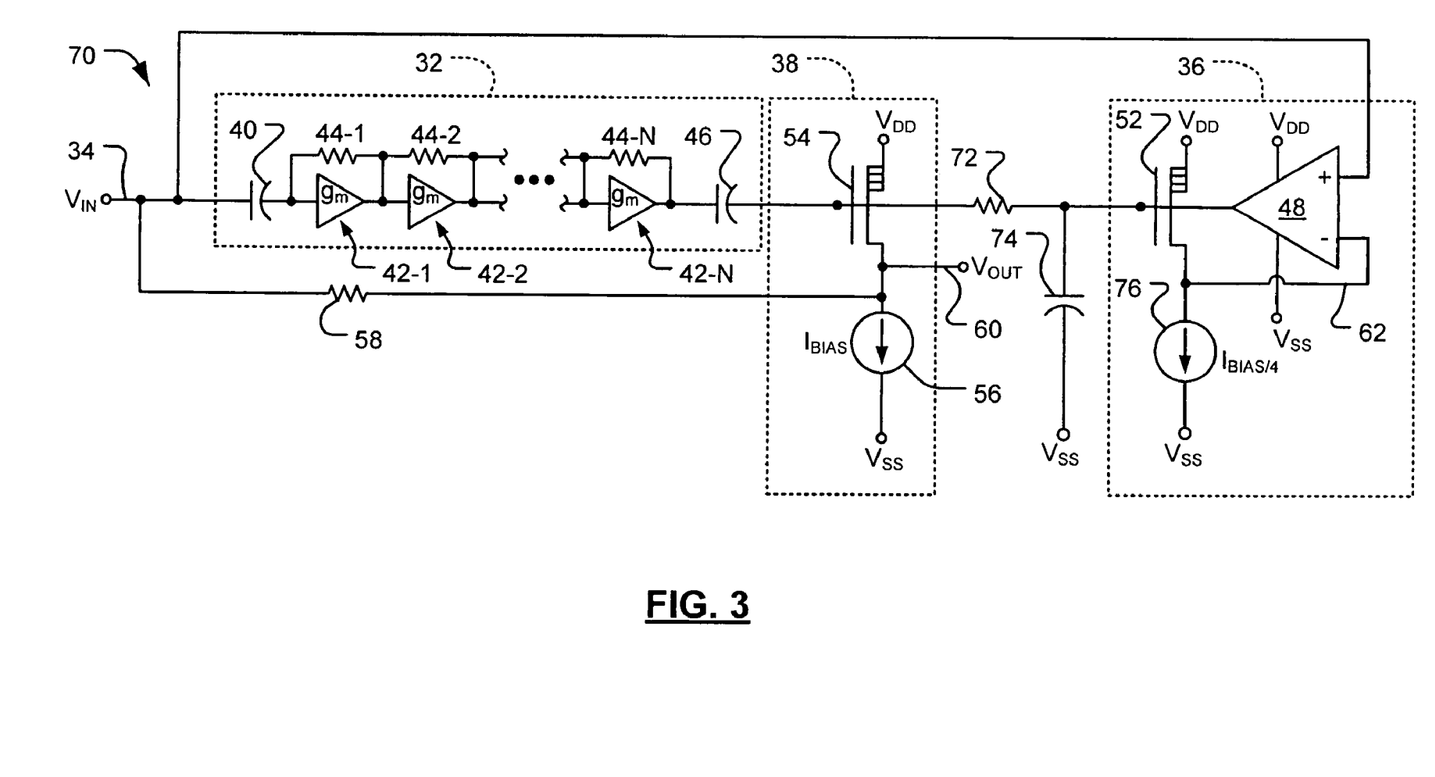
FIG. 3 is an electrical schematic of a TIA according to another implementation of the present invention.

Referring now to FIG. 3, another implementation of a TIA 70 is shown. The TIA 70 is similar to the TIA 30 of FIG. 2 with the exception of an additional resistor 72, an additional capacitor 74, and the magnitude of current flowing through a current source 76. The resistor 72 is connected between the output of the op-amp 46 and the gate of the transistor 54. The resistor 72 limits current flowing into the gate of the transistor 54 to prevent it from overshooting and driving current through resistor 58 back into the signal source (not shown) that is connected to the input node 34. The resistor 72 also limits the negative effects of the bias stage 36 on the signal through the amplifying stage 32. The capacitor 74 is connected between the output of the op-amp 46 and the power supply reference voltage $V_{SS}$. In some implementations, the capacitance of capacitor 74 is greater than 1 pF such as approximately 3 pF, although other values may be used. The capacitances of capacitors 40, 46, and 74 and resistance of resistor 72 are preferably selected such that an overall circuit gain from the input node 34 to the output node 60 is constant between the low frequency cutoff of the amplifying stage 32 and the high frequency cutoff at a later stage (not shown). For example, the current flowing through the current source 76 is one-fourth of the current $I_{BIAS}$ to conserve current and reduce power consumption of the TIA 70

Figure 3A:
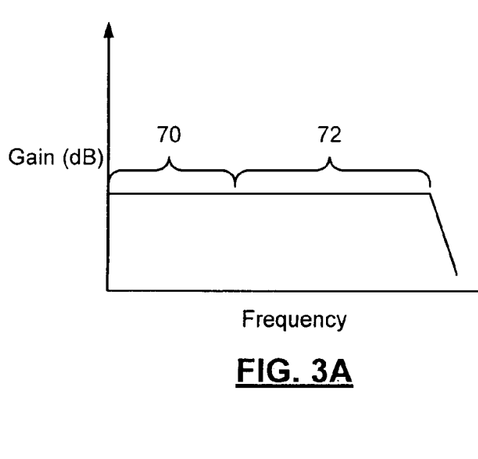
FIG. 3A is a graph depicting the frequency response of the differential mode TIA shown in FIG. 3.

Referring now to FIG. 3A, a frequency response of the TIA 70 is shown. There is a low frequency cutoff that is determined by the interaction between the capacitance 40 and the input impedance of stage 44-1 together with the interaction between the capacitance 46 and resistance 72. The frequency response in a low frequency range 70 is flat due to the removal of the capacitance 14 in FIG. 1 from the feedback path.

Those skilled in the art can now appreciate from the foregoing description that the broad teachings of the present invention can be implemented in a variety of forms. For example, the TIA circuit can be operated in single ended and differential modes. Therefore, while this invention has been described in connection with particular examples thereof, the true scope of the invention should not be so limited since other modifications will become apparent to the skilled practitioner upon a study of the drawings, the specification and the following claims.

What is claimed is:

1. A transimpedance amplifier (TIA) circuit, comprising:
an input;
an amplifying stage that includes N amplifiers, that generates a first signal and that is AC coupled to said input, where N is an integer greater than zero;
a bias stage that generates and outputs a second signal and that is DC coupled to said input; and
an output stage driven by said first signal, which is combined with and biased by said second signal.

2. A transimpedance amplifier (TIA) circuit, comprising:
an input;
an amplifying stage that includes N amplifiers, that generates a first signal and that is AC coupled to said input, where N is an integer greater than zero;
a bias stage that generates a second signal and that is DC coupled to said input; and
an output stage driven by said first signal and said second signal;
wherein said N amplifiers are connected in series and each includes an input, an output, and a feedback resistance.

3. A transimpedance amplifier (TIA) circuit, comprising:
an input;
an amplifying stage that includes N amplifiers, that generates a first signal and that is AC coupled to said input, where N is an integer greater than zero;
a bias stage that generates a second signal and that is DC coupled to said input; and
an output stage driven by said first signal and said second signal;
wherein said bias stage comprises an op-amp having a non-inverting input that communicates with said input.

4. The TIA of claim 3 wherein said bias stage further comprises:
a first current source; and
a first transistor having first and second terminals and a control terminal,
wherein said first current source communicates with said second terminal of said first transistor and an inverting input of said op-amp.

5. A transimpedance amplifier (TIA) circuit, comprising:
an input;
an amplifying stage that includes N amplifiers, that generates a first signal and that is AC coupled to said input, where N is an integer greater than zero;
a bias stage that generates a second signal and that is DC coupled to said input;
an output stage driven by said first signal and said second signal; and
a low pass filter that communicates with said bias stage.

6. A transimpedance amplifier (TIA) circuit, comprising:
an input;
an amplifying stage that includes N amplifiers, that generates a first signal and that is AC coupled to said input, where N is an integer greater than zero;
a bias stage that generates a second signal and that is DC coupled to said input;
an output stage driven by said first signal and said second signal; and
a current limiting device that communicates with said bias stage and said output stage.

7. A transimpedance amplifier (TIA) circuit, comprising:
an input;

an amplifying stage that includes N amplifiers, that generates a first signal and that is AC coupled to said input, where N is an integer greater than zero;
a bias stage that generates a second signal and that is DC coupled to said input; and
an output stage driven by said first signal and said second signal;
wherein said output stage comprises:
a first current source; and
a first transistor having first and second terminals and a control terminal,
wherein said first current source communicates with said second terminal of said first transistor.

8. A transimpedance amplifier (TIA) circuit, comprising:
an input;
an amplifying stage that includes N amplifiers, that generates a first signal and that is AC coupled to said input, where N is an integer greater than zero;
a bias stage that generates a second signal and that is DC coupled to said input and that comprises:
a first current source; and
a first transistor having first and second terminals and a control terminal, wherein said first current source communicates with said second terminal of said first transistor and an inverting input of said op-amp; and
an output stage driven by said first signal and said second signal and wherein said output stage comprises:
a second current cource; and
a second transistor having second and second terminals and a control terminal,
wherein said second current source communicates with said second terminal of said second transistor,
wherein said first current source provides a magnitude of current flow that is a fraction of the magnitude of current flowing through said second current source.

9. A transimpedance amplifier (TIA) circuit, comprising:
an input;
an amplifying stage that includes N amplifiers, that generates a first signal and that is AC coupled to said input, where N is an integer greater than zero;
a bias stage that generates a second signal and that is DC coupled to said input; and
an output stage driven by said first signal and said second signal;
wherein said output stage is DC-coupled to said input via a feedback circuit.

10. A transimpedance amplifier (TIA) circuit for amplifying an input signal, comprising:
an amplifying stage that amplifies signals in a first frequency range and that has an input and an output;
a bias stage that has an input and an output and that generates a bias signal;
a signal input node that communicates said input of said amplifying stage and said input of said bias stage;
an output stage that communicates with outputs of said amplifying and bias stages, wherein said output stage includes a signal output node; and
a feedback path DC that communicates with said signal output node and said signal input node.

11. The TIA of claim 10 wherein said amplifying stage comprises N amplifiers connected in series with a capacitor, each of said N amplifiers including an input, an output, and a feedback resistance.

12. The TIA of claim 10 wherein said bias stage comprises an op-amp having a non-inverted input that communicates with said input.

13. The TIA of claim 12 wherein said bias stage further comprises a current source connected to said op-amp.

14. The TIA of claim 10 further comprising a capacitor having one end that communicates with said bias stage and an opposite end that communicates with a reference node.

15. The TIA of claim 10 further comprising a current limiting device that communicates with said bias stage and said output stage.

16. The TIA of claim 10 wherein said output stage has a first output device, and said bias stage has a second output device, wherein said first and second output devices are performance matched.

17. The TIA of claim 13 wherein said current source provides a fraction of the current flowing through a bias source of said output stage.

18. A transimpedance amplifier (TIA) circuit, comprising:
input means for receiving an input;
amplifying stage means for amplifying that includes N amplifying means for amplifying, that generates a first signal and that is AC coupled to said input means, where N is an integer greater than zero;
bias means comprising at least one transistor means for generating a second signal, wherein said bias means is DC coupled to said input means; and
output means for generating an output and that is driven by said first signal means and said second signal.

19. A transimpedance amplifier (TIA) circuit, comprising:
input means for receiving an input;
amplifying stage means for amplifying that includes N amplifying means for amplifying, that generates a first signal and that is AC coupled to said input means, where N is an integer greater than zero;
bias means comprising at least one for generating a second signal and that is DC coupled to said input means; and
output means for generating an output and that is driven by said first signal means and said second signal;
wherein said N amplifying means each include an input, an output, and a feedback means for providing resistance.

20. A transimpedance amplifier (TIA) circuit, comprising:
input means for receiving an input;
amplifying stage means for amplifying that includes N amplifying means for amplifying, that generates a first signal and that is AC coupled to said input means, where N is an integer greater than zero;
bias means comprising at least one for generating a second signal and that is DC coupled to said input means; and
output means for generating an output and that is driven by said first signal means and said second signal;
wherein said bias means comprises operational amplifying means for amplifying and having a non-inverting input that communicates with said input means.

21. The TIA of claim 20 wherein said bias means further comprises:
first current means for providing current; and
a first transistor having first and second terminals and a control terminal,
wherein said first current means communicates with said second terminal of said first transistor and an inverting input of said operational amplifying means.

22. A transimpedance amplifier (TIA) circuit, comprising:
input means for receiving an input;
amplifying stage means for amplifying that includes N amplifying means for amplifying, that generates a first signal and that is AC coupled to said input means, where N is an integer greater than zero;
bias means comprising at least one for generating a second signal and that is DC coupled to said input means;

output means for generating an output and that is driven by said first signal means and said second signal; and filter means for filtering and that communicates with said bias means.

23. A transimpedance amplifier (TIA) circuit, comprising:
input means for receiving an input;
amplifying stage means for amplifying that includes N amplifying means for amplifying, that generates a first signal and that is AC coupled to said input means, where N is an integer greater than zero;
bias means comprising at least one for generating a second signal and that is DC coupled to said input means;
output means for generating an output and that is driven by said first signal means and said second signal; and
current limiting means for limiting current and that communicates with said bias means and said output means.

24. The TIA of claim 21 wherein said output means further comprises:
second current means for providing current; and
a second transistor having first and second terminals and a control terminal,
wherein said second current means communicates with said second terminal of said second transistor.

25. The TIA of claim 24 wherein said first current means provides a magnitude of current flow that is a fraction of the magnitude of current flowing through said second current means.

26. A transimpedance amplifier (TIA) circuit, comprising:
input means for receiving an input;
amplifying stage means for amplifying that includes N amplifying means for amplifying, that generates a first signal and that is AC coupled to said input means, where N is an integer greater than zero;
bias means comprising at least one for generating a second signal and that is DC coupled to said input means; and
output means for generating an output and that is driven by said first signal means and said second signal;
wherein said output means is DC-coupled to said input means via a feedback means.

27. A transimpedance amplifier (TIA) circuit for amplifying an input signal, comprising:
amplifying stage means for amplifying signals in a first frequency range and having an input and an output;
bias means for generating a bias signal and having an input and an output;
input means for receiving input signals and that communicates with said input of said amplifying stage means and said input of said bias means;
output means for generating an output and that communicates with outputs of said amplifying stage means and said bias means; and
feedback means for providing feedback and that is DC coupled between said output means and said input means.

28. The TIA of claim 27 wherein said amplifying stage means comprises N amplifying means for amplifying connected in series with capacitance means for providing capacitance, each of said N amplifying means including an input, an output, and resistance means for providing resistance.

29. The TIA of claim 27 wherein said bias means comprises operational amplifying means for amplifying and having a non-inverted input that communicates with said input means.

30. The TIA of claim 29 wherein said bias means further comprises current means for providing current and that communicates with said operational amplifying means.

31. The TIA of claim 27 further comprising capacitance means for providing a capacitance and having one end that communicates with an output of said bias means and an opposite end that communicates with a reference node.

32. The TIA of claim 27 further comprising current limiting means for limiting current and that communicates with said bias means and said output means.

33. The TIA of claim 27 wherein said output means includes first output means for generating an output, and said bias means includes second output means for generating an output, wherein said first and second output means are performance matched.

34. The TIA of claim 30 wherein said current means provides a fraction of the current flowing through a bias source of said output means.

35. A method for providing a transimpedance amplifier (TIA) circuit, comprising:
providing input signals to an input;
providing an amplifying stage including N amplifiers;
AC coupling said amplifying stage to said input;
generating a first signal using said amplifying stage;
generating and outputing a second signal using a bias stage that is DC coupled to said input; and
generating an output based on said first signal biased by said second signal.

36. A method for providing a transimpedance amplifier (TIA) circuit, comprising:
providing input signals to an input;
providing an amplifying stage including N amplifiers, where N is an integer greater than zero;
AC coupling said amplifying stage to said input;
generating a first signal using said amplifying stage;
generating a second signal using a bias stage that is DC coupled to said input;
generating an output based on said first signal and said second signal; and
connecting said N amplifiers in series, wherein each of said N amplifiers include an input, an output, and a feedback resistance.

37. A method for providing a transimpedance amplifier (TIA) circuit, comprising:
providing input signals to an input;
providing an amplifying stage including N amplifiers, where N is an integer greater than zero;
AC coupling said amplifying stage to said input;
generating a first signal using said amplifying stage;
generating a second signal using a bias stage that is DC coupled to said input;
generating an output based on said first signal and said second signal; and
wherein said bias stage comprises an op-amp having a non-inverting input that communicates with said input.

38. A method for providing a transimpedance amplifier (TIA) circuit, comprising:
providing input signals to an input;
providing an amplifying stage including N amplifiers, where N is an integer greater than zero;
AC coupling said amplifying stage to said input;
generating a first signal using said amplifying stage;
generating a second signal using a bias stage that is DC coupled to said input;
generating an output based on said first signal and said second signal; and
filtering an output of said bias stage.

39. A method for providing a transimpedance amplifier (TIA) circuit, comprising:
providing input signals to an input;

providing an amplifying stage including N amplifiers, where N is an integer greater than zero;
AC coupling said amplifying stage to said input;
generating a first signal using said amplifying stage;
generating a second signal using a bias stage that is DC coupled to said input;
generating an output based on said first signal and said second signal; and
limiting current flowing between said bias stage and said output.

40. A method for providing a transimpedance amplifier (TIA) circuit, comprising:

providing input signals to an input;
providing an amplifying stage including N amplifiers, where N is an integer greater than zero;
AC coupling said amplifying stage to said input;
generating a first signal using said amplifying stage;
generating a second signal using a bias stage that is DC coupled to said input;
generating an output based on said first signal and said second signal using an output stage; and
DC-coupling said output to said input.

* * * * *

UNITED STATES PATENT AND TRADEMARK OFFICE
CERTIFICATE OF CORRECTION

PATENT NO.         : 7,518,447 B1
APPLICATION NO.    : 11/037733
DATED              : April 14, 2009
INVENTOR(S)        : Kee Hian Tan et al.

It is certified that error appears in the above-identified patent and that said Letters Patent is hereby corrected as shown below:

Column 1, Line 27    Delete "VOUT" and insert -- $V_{OUT}$ --
Column 3, Line 26    Delete "Vout" and insert -- $V_{OUT}$ --
Column 3, Line 53    Insert -- . -- after "70"
Column 5, Line 28    Delete "cource" and insert -- source --
Column 5, Line 29    Delete "second and" after "having"

Signed and Sealed this

Thirtieth Day of June, 2009

JOHN DOLL
*Acting Director of the United States Patent and Trademark Office*